(12) United States Patent
Matsumoto et al.

(10) Patent No.: US 9,190,226 B2
(45) Date of Patent: Nov. 17, 2015

(54) SWITCH

(75) Inventors: Tsuyoshi Matsumoto, Suita (JP); Tetsuya Akagi, Kyoto (JP); Shunkichi Sasaki, Osaka (JP); Tatsuya Iida, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 139 days.

(21) Appl. No.: 13/699,121

(22) PCT Filed: Mar. 16, 2011

(86) PCT No.: PCT/JP2011/056226
§ 371 (c)(1),
(2), (4) Date: May 24, 2013

(87) PCT Pub. No.: WO2012/035803
PCT Pub. Date: Mar. 22, 2012

(65) Prior Publication Data
US 2013/0233683 A1   Sep. 12, 2013

(30) Foreign Application Priority Data

Sep. 17, 2010   (JP) ................................. 2010-209264

(51) Int. Cl.
*H01H 9/28*   (2006.01)
*H03K 17/968*   (2006.01)
(Continued)

(52) U.S. Cl.
CPC .............. *H01H 9/285* (2013.01); *H03K 17/968* (2013.01); *H01H 27/002* (2013.01); *H03K 2017/9706* (2013.01)

(58) Field of Classification Search
CPC ......... H01H 19/00; H01H 3/16; H01H 9/285; H01H 9/286; H01H 27/002; H02K 2017/9706

USPC .............. 250/216, 221, 222.1, 214 SW, 239; 200/42.01, 42.02, 43.04, 43.05, 43.06, 200/43.11, 61.02, 61.19; 340/555, 556, 340/557, 567, 12.55, 13.32
See application file for complete search history.

(56) References Cited

U.S. PATENT DOCUMENTS 7,834,280 B2 * 11/2010 Poyner ...................... 200/19.06
2007/0074962 A1    4/2007 Poyner et al.

FOREIGN PATENT DOCUMENTS

DE           100 00 799 C1     5/2001
EP           0 814 490 A2    12/1997
(Continued)

OTHER PUBLICATIONS

International Search Report Application No. PCT/JP2011/056226, mailed on May 24, 2011.
(Continued)

*Primary Examiner* — Georgia Y Epps
*Assistant Examiner* — Don Williams
(74) *Attorney, Agent, or Firm* — Nutter McClennen & Fish LLP; John J. Penny, Jr.

(57) ABSTRACT

A door switch includes a casing, a cam, the cam being caused to operate by manipulation of a manipulation key, and a detection unit for detecting an operating state of the cam. The casing houses at least a part of the cam and the detection unit. The cam is configured to be caused to operated by insert manipulation of inserting the manipulation key into the casing when the manipulation key has a shape adapted to a shape of the cam, and not to be caused to operate by the insert manipulation when the manipulation key does not have a shape adapted to the shape of the cam. The door switch can be adapted to Category 2 of ISO 13849-1.

5 Claims, 15 Drawing Sheets

(51) Int. Cl.
*H01H 27/00* (2006.01)
*H03K 17/97* (2006.01)

(56) References Cited

FOREIGN PATENT DOCUMENTS

| EP | 0 837 485 | A2 | 4/1998 |
| EP | 1 770 735 | A1 | 4/2007 |
| JP | 9-061446 | A | 3/1997 |
| JP | 10-092270 | A | 4/1998 |
| JP | 2010-123306 | A | 6/2010 |
| JP | 2010-157488 | A | 7/2010 |

OTHER PUBLICATIONS

Extended European Search Report for Application No. 11824816.0, issued Nov. 4, 2014 (6 pages).

\* cited by examiner

FIG.1

| CATEGORY | SUMMARY OF REQUIREMENTS | BEHAVIOR OF SYSTEM | PRINCIPLE FOR ENSURING SAFETY | MTTF$_d$ OF EACH CHANNEL | DC$_{avg}$ | CCF |
|---|---|---|---|---|---|---|
| B | Designed, selected, and assembled in accordance with relevant standards in order to withstand usage environmental stress. Basic safety principles shall be applied. | Safety function will be lost upon a failure. | Mainly based on selection of parts | Low to Medium | None | Not applicable |
| 1 | The requirements of Category B shall be applied together with the use of well-tried parts and well-tried safety principles. | Although safety function will be lost upon a failure, the probability of occurrence of a failure is lower than Category B. | | High | | |
| 2 | The requirements of Category B shall be applied together with the use of well-tried parts and well-tried safety principles. The safety function shall be tested by a machine control system at adequate intervals. | Safety function will be lost if a failure occurs between tests. The loss of safety function is detected by the test. | | Low to High | Low to Medium | |
| 3 | The requirements of Category B shall be applied together with the use of well-tried safety principles. Safety-related parts shall be designed in accordance with the following:<br>· A single failure shall not lead to the loss of safety function.<br>· A single failure shall be detected whenever possible. | Even if a single failure occurs, safety function is maintained. Not all failures can be detected. Therefore, the safety function will be lost due to an accumulation of undetected failures. | Mainly based on the structure | Low to High | Low to Medium | |
| 4 | The requirements of Category B shall be applied together with the use of well-tried safety principles. Safety-related parts shall be designed in accordance with the following:<br>· A single failure shall not lead to the loss of safety function.<br>· A single failure shall be detected before the next safety function works. Safety function shall not be lost due to an accumulation of undetected single failures. | Even if a single failure occurs, safety function is maintained. High DC provides a low probability of an accumulation of failures. In order to prevent the loss of safety function, a failure is detected within a certain time period. | | High | High Include Accumulated Failures | Score 65 or more |

LOW →→→ HIGH

SWITCH

TECHNICAL FIELD

The present invention relates to a switch, and more particularly to an interlock switch used for a control system for ensuring the safety of mechanical equipment.

BACKGROUND ART

Conventionally, in industrial machines and the like, for the purpose of ensuring the safety of workers, a machine is sometimes enclosed with a protective wall, and a protective door for the entry into the inside of the wall provided. Generally, in such a configuration, an interlock switch (or safety switch) for detecting whether or not the protective door is completely closed is provided, and a safety system which does not allow the machine to be driven when the protective door is not completely closed is constructed.

The interlock switch is generally configured to include a switch body and an actuator (for example, a key). The switch body is provided on a protective wall surface surrounding the protective door. The actuator is provided at the protective door in such a manner that when the protective wall is closed, the actuator is inserted into an insertion opening for the actuator provided in the switch body.

When the protective door is closed, the actuator is inserted to actuate an operation unit in the interior of the switch body, such as a cam, and a switch built in the switch body is thereby closed. Power is thereby supplied to the machine, making the machine operable.

On the other hand, when the protective door is opened, the actuator is pulled out of the switch body, and the switch of the switch body is thereby opened. Power supply to the machine is thereby interrupted.

Some such interlock switches are configured such that a first portion including the aforementioned operation unit and a second portion including the switch are separable from each other. With such a configuration, an excessive impact applied to the interlock switch may separate the first portion and the second portion from each other. For instance, with a structure in which the pushing force of the operation unit opens the switch above when the actuator is pulled out, upon the separation between the first portion and the second portion, the aforementioned pushing force will disappear, and the switch will be closed. This results in that power is supplied to the machine even when the protective door is not in a completely closed state, and the safety of workers can no longer be ensured.

Japanese Patent Laying-Open No. 2010-157488 (PTL 1) discloses a safety switch which is configured to be separable into a first portion and a second portion in a manner as above and has a structure in which upon the separation between the first portion and the second portion, a switch operates in an opening direction so that the safety is ensured.

CITATION LIST

Patent Literature

PTL 1: Japanese Patent Laying-Open No. 2010-157488
PTL 2: Japanese Patent Laying-Open No. 2010-123306

SUMMARY OF INVENTION

Technical Problem

With interlock switches having a structure configured as two separable portions in a manner as described above, even if the safety is ensured by the structure as described in Japanese Patent Laying-Open No. 2010-157488 (PTL 1), the possibility of the separation between these two portions due to an impact or the like cannot be eliminated. Therefore, it is desirable to provide an inherently inseparable form.

In addition, such a configuration comprising the first portion and the second portion provides a switch body having a rectangular-parallelepiped-like shape, thus sometimes leads to difficulty in mounting depending on an opening/closing direction of the protective door and the structure of surrounding machinery, and requires design variations with changes in insertion position of an actuator or the like.

Further, as in Japanese Patent Laying-Open No. 2010-157488 (PTL 1), in an interlock switch, a large volume is occupied by parts such as a contact module which comprises a moving contact and a fixed contact, and a plunger which transmits driving force from a cam to the moving contact. In view of the spacing between the contacts and the transmission of the driving force, there is a limit on downsizing of these parts.

Further, in recent years, a safety circuit using such an interlock switch is sometimes required to comply with the criteria of Category 2 of ISO 13849-1. ISO 13849-1 is an international standard which provides magnitude of risk and corresponding performance of a safety system in considering safety protection in the measures to reduce the risk of a machine. The performance criteria for a safety system are generally expressed in terms of "category". "Category" is architecture of a safety control system and based on an electromechanical-parts-based or so-called deterministic technology as represented by a contact technology for a switch and a relay which has hitherto been developed.

FIG. 1 illustrates categories defined in ISO 13849-1. Referring to FIG. 1, in ISO 13849-1, categories of five stages, "B", "1", "2", "3" and "4" are provided. The further the category advances from "B" to "4", the higher level of performance criteria is achieved.

In addition, in a revised edition of ISO 13849-1, as an evaluation index for a safety control system, indexes called "PL (Performance Level)" are defined, which are of five stages of "a" to "e", respectively. PL incorporates concepts of "reliability" and "quality" into a concept of conventional "category" and evaluates mean time to dangerous failure (MTTFd), average diagnostic coverage (DCavg), and common cause failure (CCF). PL makes it possible to quantitatively evaluate a safety control system in line with actual usage.

It is noted that the official name for the revised edition of ISO 13849-1 is "ISO 13849-1 (Second edition 2006-11-01) Safety of machinery Safety-related parts of control systems, Part 1: General principles for design". The revised edition of ISO 13849-1 will hereinafter be sometimes referred to as "ISO 13849-1: 2006". The former and revised versions of ISO 13849-1 will be collectively referred to as "ISO 13849-1" when it is not necessary to make any particular distinction between them.

In ISO 13849-1: 2006, requirements for a safety control system required for each category are the same as those in the former edition. Nevertheless, safety control systems are schematized based on three portions, I (input device), L (logical operation device), O (output device), in a manner allowing their respective characteristics to be easily understood.

FIG. 2 is a block diagram for illustrating requirements for a safety control system required for each category, which are given by ISO 13849-1: 2006.

Referring to FIG. 2, a structure to be applied to Category B and Category 1 can be realized by I, L, and O. A structure to be applied to Category 2 can be realized by, for example, adding TE (test equipment) to the I, L, and O above. It is noted that the structure to be applied to Category 2 can also be realized by, for example I, O, and TE. OTE is a function for executing an operation based on an output of TE. OTE may be a function included in O (output device) or a function of a device distinct from the I, L, and O above.

A structure to be applied to Categories 3 and 4 can be realized by duplexing the I, L, and O above. Although Category 4 differs from Category 3 in that Category 4 is required of a higher detection capacity than that of Category 3, Category 4 is the same as Category 3 in structure.

As shown in FIG. 2, the requirements for Category 2 include checking that the input device and the output device are normal.

FIG. 3 is a graph for illustrating a method of evaluating the performance level defined in ISO 13849-1: 2006. Referring to FIG. 3, in order to evaluate PL, four parameters are used, which are category (denoted as "Cat" in FIG. 3), MTTFd, DCavg, and CCF.

As shown in FIG. 3, there is a plurality of combinations of parameters that can achieve performance level "c", for example. In other words, a suitable combination of the four parameters above can achieve a desired performance level. Therefore, ISO 13849-1: 2006 provides a high degree of flexibility in constructing a safety system as compared with the former edition, ISO 13849-1:1999.

As such, in order for an interlock switch to comply with criteria of Category 2 of ISO 13849-1, it is necessary to have a configuration that enables a check by an external controller or the like as to whether or not the switch itself is normal.

The present invention has been made to solve the problems above, and an object of the invention is to provide an interlock switch capable of reducing a breakage due to an impact and ensuring safety when used for a safety system.

Solution to Problem

A switch according to the present invention includes: a first casing; an operation unit configured to be caused to operate by manipulation of an actuator; and a detection unit configured to detect an operating state of the operation unit and outputting a signal concerning the detected operating state. The first casing houses the operation unit and at least a part of the detection unit.

Preferably, the actuator includes a key. The operation unit is configured to be caused to operate by insert manipulation of inserting the key into the first casing when the key has a shape adapted to a shape of the operation unit, and not to be caused to operate by the insert manipulation when the key does not have a shape adapted to the shape of the operation unit.

Preferably, the detection unit includes a detection element for optically detecting the operating state of the operation unit.

Preferably, the detection element is a photomicrosensor.

Preferably, the operation unit in the operating state permits light of the detection unit to pass, and the operation unit in a non-operating state blocks the light.

Preferably, the detection unit includes a detection element for magnetically detecting the operating state of the operation unit.

Preferably, the first casing has a substantially cubic shape.

Preferably, the switch further includes a second casing coupled to the first casing. When the first casing and the second casing are separated from each other, the detection unit outputs a signal indicating that the operation unit is in a non-operating state.

Preferably, the switch further includes a circuit board for driving the detection unit. The operation unit and the detection unit are housed in the first casing. The circuit board is housed in the second casing. The detection unit outputs a signal indicating that the operation unit is in a non-operating state when the first casing and the second casing are separated from each other and accordingly signal transmission between the detection unit and the circuit board is interrupted.

Preferably, the switch further includes an input unit configured to receive an externally supplied test signal for monitoring whether or not there is a malfunction in the switch. The detection unit outputs a signal corresponding to the test signal received at the input unit when no malfunction has occurred.

Preferably, the detection unit includes at least two detection elements.

Advantageous Effects of Invention

The present invention provides an interlock switch capable of reducing a breakage due to an impact and ensuring safety when used for a safety system.

BRIEF DESCRIPTION OF DRAWINGS

FIG. 1 illustrates categories defined in ISO 13849-1.

DESCRIPTION OF EMBODIMENTS

Figure 2:
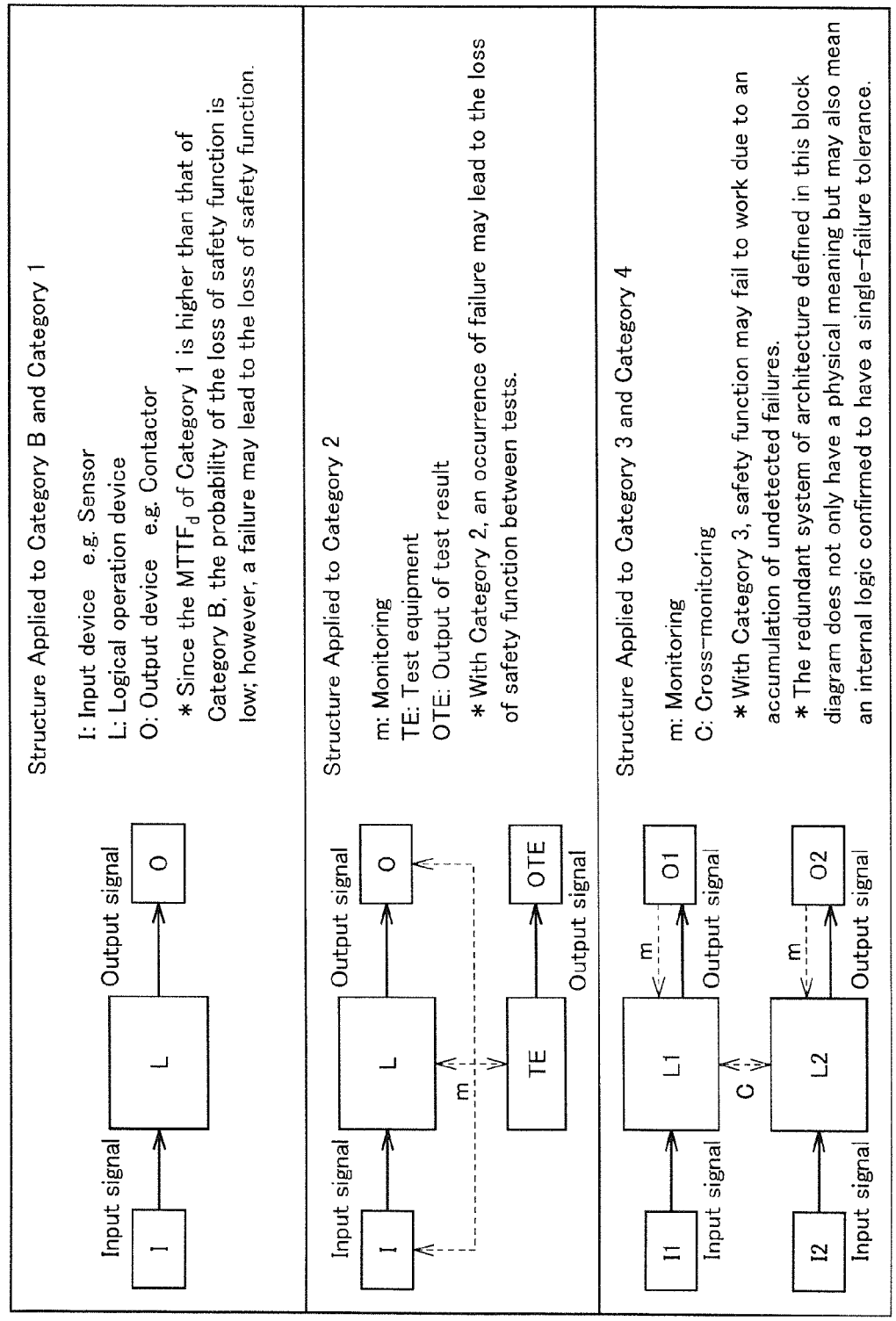
FIG. 2 is a block diagram for illustrating requirements for a safety control system required for each category, which are given by ISO 13849-1: 2006.

An embodiment of the present invention will be described hereinafter in detail with reference to the drawings. In the drawings, the same or corresponding portions are denoted by the same reference signs, and a description thereof will not be repeated.

Basic Configuration of Safety Control System

Figure 4:
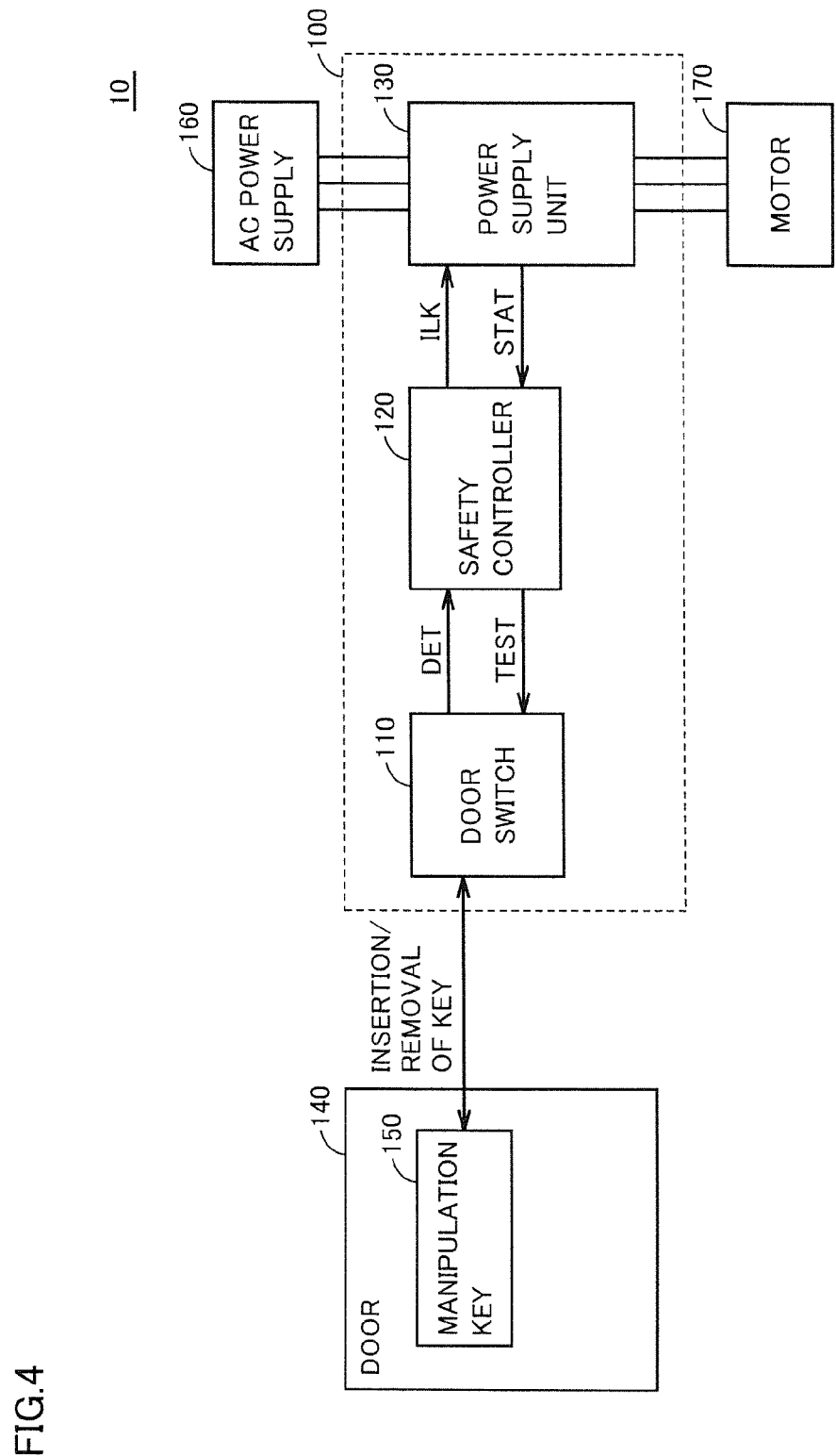
FIG. 4 is a configuration diagram showing a common example of a safety control system using an interlock switch complying with the criteria of Category 2 of ISO 13849-1.

FIG. 4 is a configuration diagram showing a common example of a safety control system 10 using an interlock switch complying with the criteria of Category 2 of ISO 13849-1. Referring to FIG. 4, safety control system 10 supplies driving power from an AC power supply 160 to a motor 170 as a load and interrupts the driving power. It is noted that although FIG. 4 illustrates, by way of example and without limitation, a configuration using a motor as a load, the load can have any configuration that operates using electric power.

A control system 100 includes an interlock switch (hereinafter also referred to as "door switch") 110 as an input device, a safety controller 120, and a power supply unit 130.

Power supply unit 130 has the function of being able to make a switch between supply and interruption of power from AC power supply 160 to motor 170, in accordance with a signal which is based on the state of door switch 110 and from safety controller 120. As power supply unit 130, for example, a power conversion apparatus such as a contactor, servo driver, or inverter inserted on a power path from AC power supply 160 to motor 170 can be employed.

Door switch 110 is a switch for detecting that a mechanical guard or cover is closed. Door switch 110 is caused to operate by insertion/removal of a manipulation key 150 mounted on a door 140. This causes door switch 110 to detect opening/closing of door 140 and to output a signal DET indicating opening/closing of door 140 to safety controller 120. It is noted that manipulation key 150 used here has a shape adapted to a shape of an operation unit which is provided in the interior of door switch 110 and will be described later in FIG. 8 and the like. When a manipulation key which is not adapted to a shape of the operation unit is used, door switch 110 cannot be caused to operate.

The configuration of door switch 110 is not limited to a configuration which is caused to operate by insertion/removal of manipulation key 150 in a manner as described above, and may be, for example, a configuration which is caused to operate a lever provided at door switch 110 by closure of door 140. However, it is desirable from the standpoint of safety to use a door switch as above which uses a manipulation key so that a worker and the like cannot perform a disabling manipulation which allows a machine to be caused to operate by an intentional manipulation of the door switch despite the fact that the door remains in an opened state. It is noted that the door switch may be configured as a contactless door switch using an actuator adapted to door switches.

Safety controller 120 receives a detection signal DET from door switch 110. Based on this detection signal DET, safety controller 120 then outputs an interlock signal ILK to power supply unit 130. Specifically, when door 140 is opened, interlock signal ILK is set to interrupt driving power from power supply unit 130 to motor 170. On the other hand, when door 140 is closed, interlock signal ILK is set to allow driving power to be supplied from power supply unit 130 to motor 170.

In addition, safety controller 120 receives, from power supply unit 130, a signal STAT indicating whether or not there is a malfunction in power supply unit 130. When it is detected that a malfunction has occurred in power supply unit 130, interlock signal ILK is set to interrupt supply of driving power from power supply unit 130 to motor 170.

Further, in order to determine whether or not door switch 110 is normal, safety controller 120 outputs a test signal TEST to door switch 110, for example, at a predetermined time interval. When a signal received from door switch 110 in response to test signal TEST does not have a signal pattern corresponding to the test signal, safety controller 120 determines that a malfunction has occurred in door switch 110 and interrupts supply of power from power supply unit 130. When door switch 110 is capable of outputting a signal indicating whether or not there is a malfunction in itself, safety controller 120 may use the signal to determine whether or not there is a malfunction.

That is, with such a configuration, safety controller 120 monitors door switch 110 and power supply unit 130 and outputs a result of the monitoring (detection result) to power supply unit 130. Thus, control system 100 has a configuration in conformity with Category 2 of ISO 13849-1. Specifically, door switch 110 realizes the function of the input device (I) in FIG. 2, safety controller 120 realizes the functions of the logical operation device (L) and test equipment (TE) in FIG. 2, and power supply unit 130 realizes the functions of the output device (O) and an output of test result (OTE) in FIG. 2.

Figure 3:
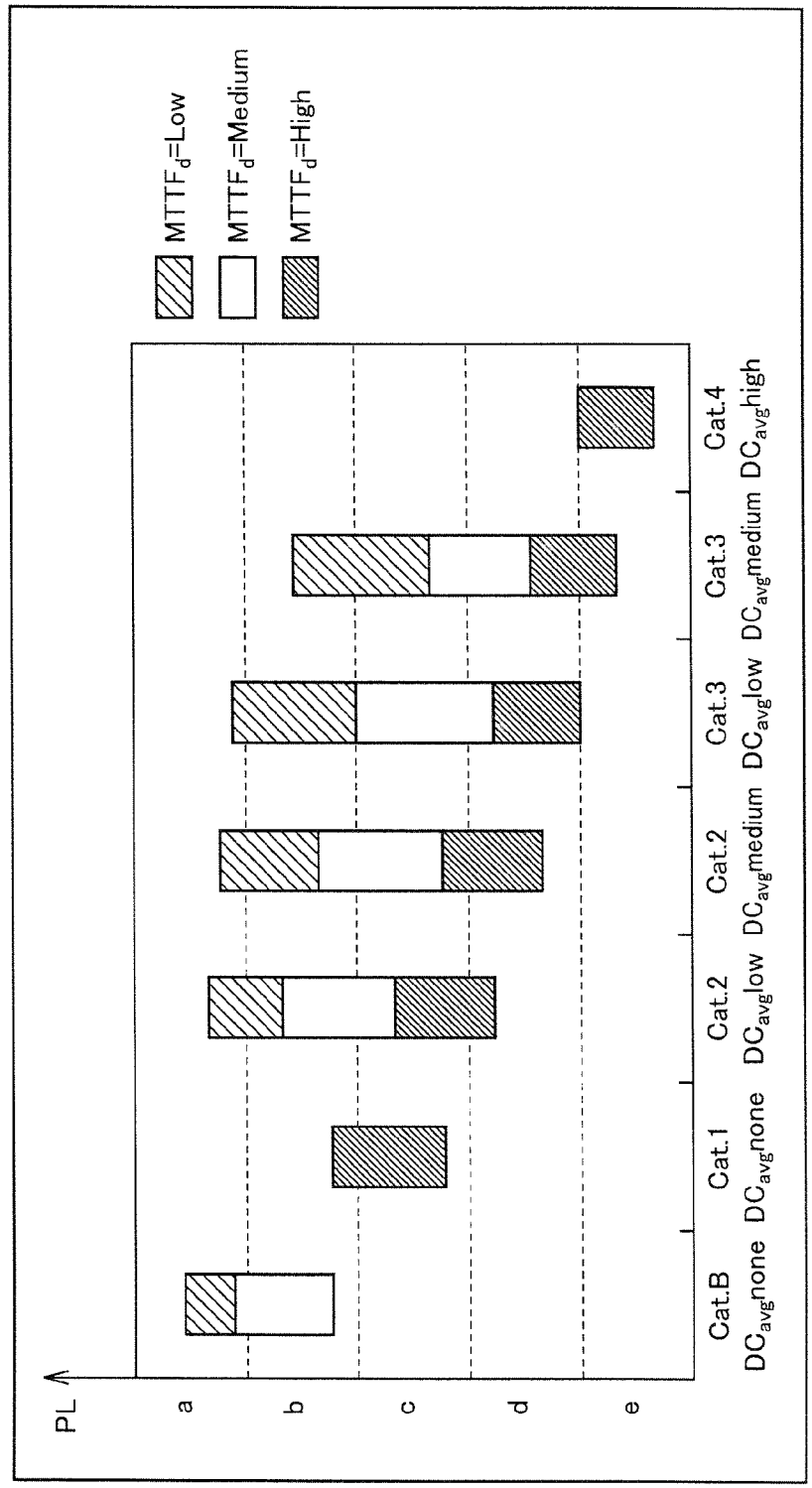
FIG. 3 is a graph for illustrating a method of evaluating the performance level defined in ISO 13849-1: 2006.

It is noted that as shown in FIG. 3, according to ISO 13849-1: 2006, Category 2 can achieve PLs (Performance Levels) "a" to "d". Therefore, a system shown in FIG. 4 can construct a system which can be adapted to performance levels "a" to "d".

Problems of Conventional Door Switch

Figure 5:
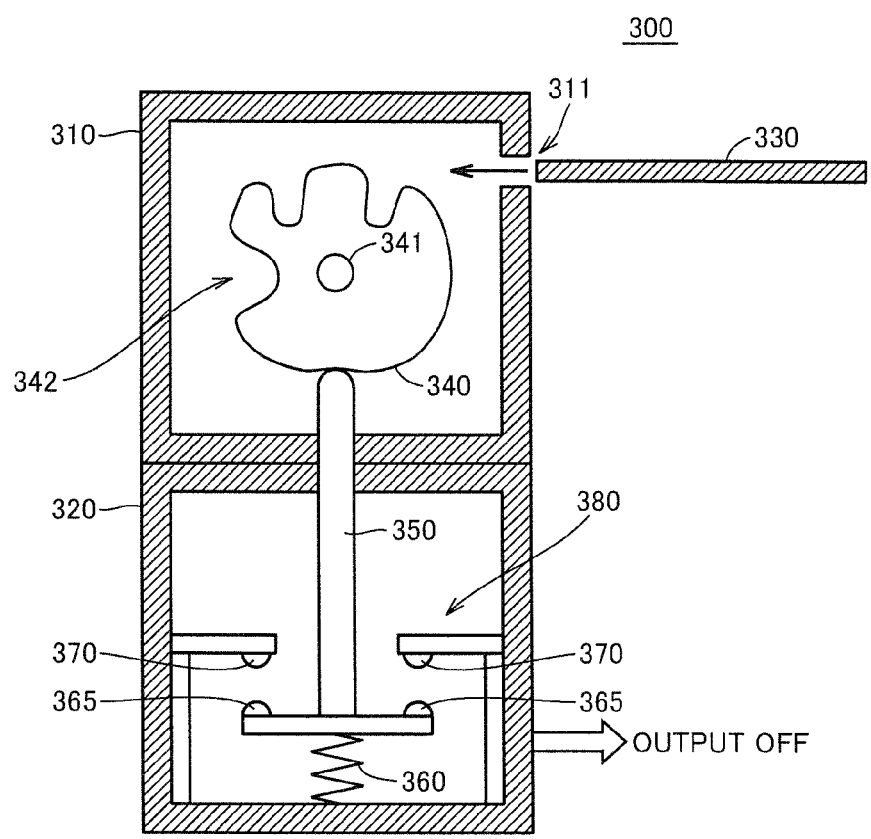
FIG. 5 is a first diagram for illustrating the structure of an interlock switch in a comparative example.

Next, referring to FIGS. 5 to 7, problems of a conventional door switch will be described. Referring to FIG. 5, a door switch 300 is configured to include a first casing 310 including a cam 340 as an operation unit and a second casing 320 including a manipulation rod 350, a spring mechanism 360, and a detection unit 380. Detection unit 380 includes a moving contact 365 and a fixed contact 370.

Cam 340 is caused to rotate about a rotation shaft 341 by insertion of a manipulation key 330 serving as an actuator from an insertion opening 311 formed in first casing 310. Cam 340 is in contact with manipulation rod 350 for causing moving contact 365 of detection unit 380 to operate. Manipulation rod 350 is biased in a direction of cam 340 by spring mechanism 360.

When manipulation key 330 is not inserted as in as in FIG. 5, cam 340 depresses manipulation rod 350 to bring fixed contact 370 and moving contact 365 out of contact with each other. This causes door switch 300 to output a detection signal of OFF.

Figure 6:
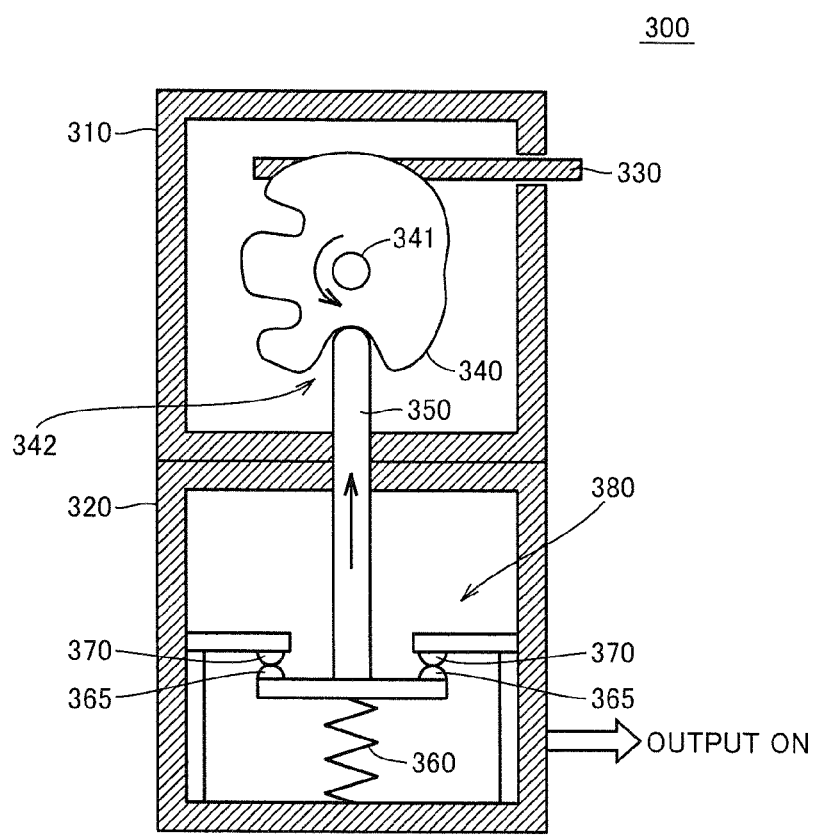
FIG. 6 is a second diagram for illustrating the structure of the interlock switch in the comparative example.
Figure 7:
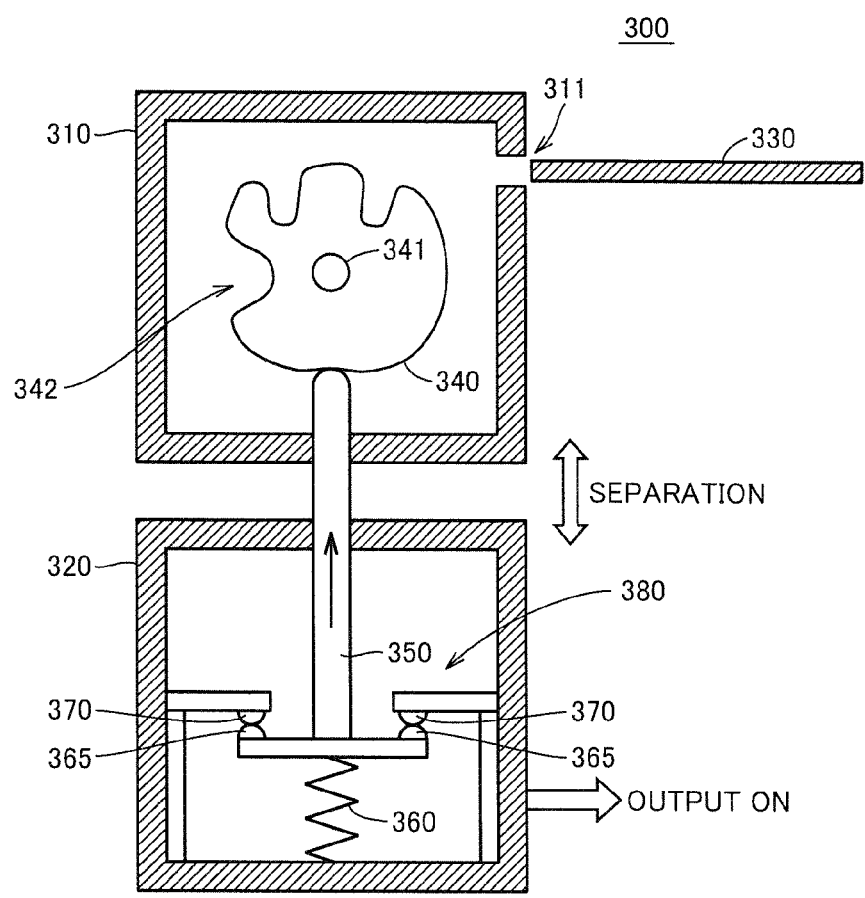
FIG. 7 is a third diagram for illustrating the structure of the interlock switch in the comparative example.

When manipulation key 330 is inserted as in FIG. 6, cam 340 rotates, and a notch 342 formed in cam 340 moves to the position of manipulation rod 350. Manipulation rod 350, which has been depressed by cam 340, is then pushed up by biasing force from spring mechanism 360, which brings fixed contact 370 and moving contact 365 into contact with each other. This causes door switch 300 to output a detection signal of ON.

In this way, a configuration in which a head unit as first casing 310 and a switch unit as second casing 320 are separable from each other has an advantage of, for example, allowing them to be made into a common lever-type limit switch through such a change in the shape of the head unit that a lever is directly mounted on rotation shaft 341 of cam 340, and enabling the switch unit to be compatible. In contrast, there is a possibility that such first casing 310 and second casing 320 are separated from each other when, for example, strong impact force is applied to door switch 300. In such case, as shown in FIG. 7, manipulation rod 350, which has been depressed by cam 340, is pushed up by separation between first casing 310 and second casing 320. Fixed contact 370 and moving contact 365 are then brought into contact with each other, and it could occur that a detection signal of ON is output even when manipulation key 330 is in a removed state, that is, the door is in an opened state. This could result in an occurrence of a problem that a failure of door switch 300 leads to a state in which the safety is not ensured.

In addition, since door switch 300 has a mechanical unit such as manipulation rod 350, the switch as a whole has a substantially rectangular-parallelepiped-like shape. Therefore, a direction of mounting could be restricted depending on an opening/closing direction of a door and the state of machinery surrounding the door. To solve this problem, it may be possible to design the head unit to have variations with changes in insertion direction of the manipulation key; however, that could cause an increase in cost from view points of designing and manufacturing.

Thus, a door switch according to the present embodiment is configured to include a detection unit in the same casing in which a cam as an operation unit is in, thereby eliminating a malfunction due to separation between the operation unit and the detection unit and downsizing the switch as a whole to ease restrictions in mounting.

Configuration of Door Switch

Figure 8:
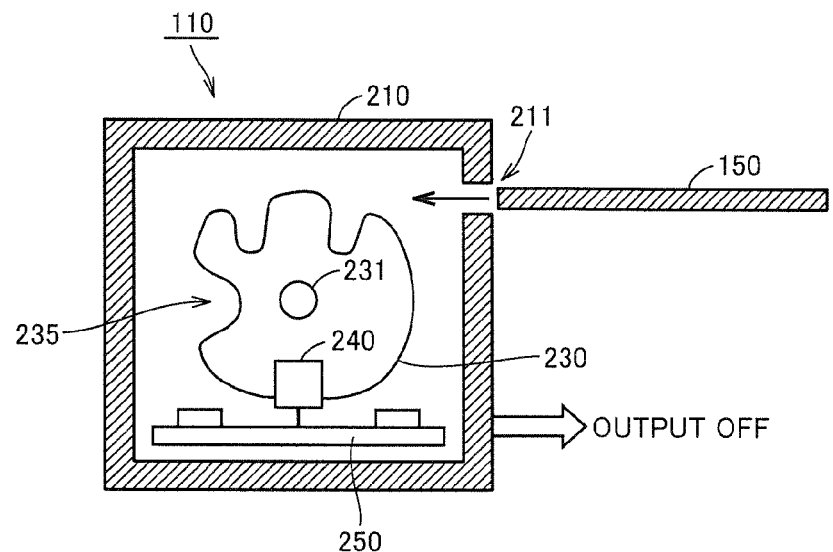
FIG. 8 is a first diagram for illustrating the structure of an interlock switch according to an embodiment.
Figure 9:
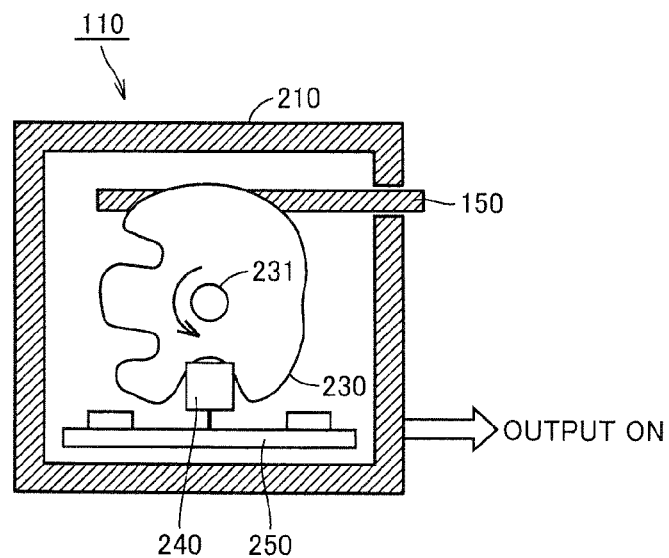
FIG. 9 is a second diagram for illustrating the structure of the interlock switch according to the embodiment.
Figure 10:
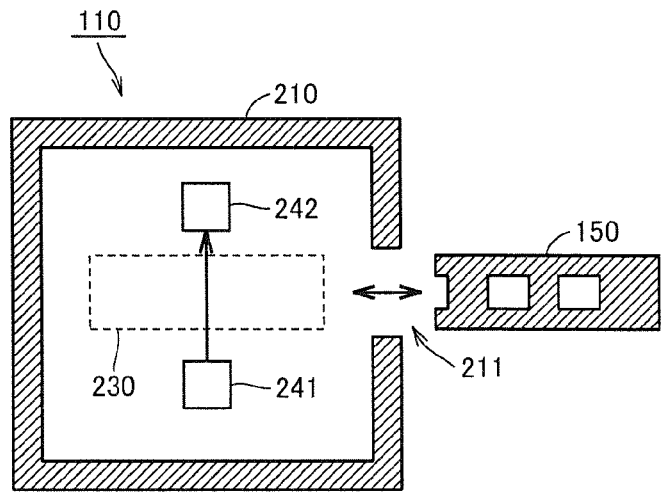
FIG. 10 is a third diagram for illustrating the structure of the interlock switch according to the embodiment.

FIGS. 8 to 10 are diagrams for illustrating an internal structure of door switch 110 according to the present embodiment. FIG. 8 shows a state in which manipulation key 150 is removed, while FIG. 9 shows a state in which manipulation key 150 is inserted. FIG. 10 shows a state when viewed from the top of FIG. 8 or 9.

Referring to FIGS. 8 to 10, door switch 110 includes a cam 230, a detection unit 240, and a circuit board 250 for driving detection unit 240 and further includes a casing 210 for housing them together.

As with cam 340 in a comparative example described in FIG. 5, cam 230 is caused to rotate about a rotation shaft 231 by insertion of manipulation key 150 from an insertion opening 211 formed in casing 210.

Detection unit 240 is an optical detection element such as a photo-micro detection element and provided with a light emitting unit 241 and a light receiving unit 242 which interpose cam 230 therebetween as shown in FIG. 10. In a state in which manipulation key 150 is removed (that is, the door is opened), as shown in FIG. 8, cam 230 interrupts light from light emitting unit 241; therefore, a detection signal of OFF is output from door switch 110. On the other hand, as shown in FIG. 9, in a state in which manipulation key 150 is inserted (that is, the door is closed), a notch 235 formed in cam 230 moves to the position of detection unit 240. Light from light emitting unit 241 is thereby allowed to pass and detected by light receiving unit 242. This causes door switch 110 to output a detection signal of ON.

The operation unit and the detection unit configured to be housed in a single-body casing in a manner as described above make it possible to intrinsically eliminate separation between a head unit and a switch unit.

In addition, the detection unit configured using an electronic device capable of detecting an operating state of the operation unit even if there is no mechanical unit, such as a photo-micro detection element, enables the switch as a whole to be downsized and to have a substantially cubic shape as shown in FIG. 8 and the like. Dimensional restrictions in mounting the switch can thereby be eased.

Variation of Detection Unit

It is noted that the detection unit is not limited to a configuration in which a light emitting unit and a light receiving unit are provided interposing a cam therebetween in a manner as described above. For instance, a reflective optical detection element in which a light emitting unit and a light receiving unit are combined together may be arranged at the position of light emitting unit 241 in FIG. 10, and a reflector may be arranged at the position of light receiving unit 242. Alternatively, an optical distance detection element may be used to detect the operating state based on the difference between a distance to the cam and a distance to an inner wall of the casing.

Figure 11:
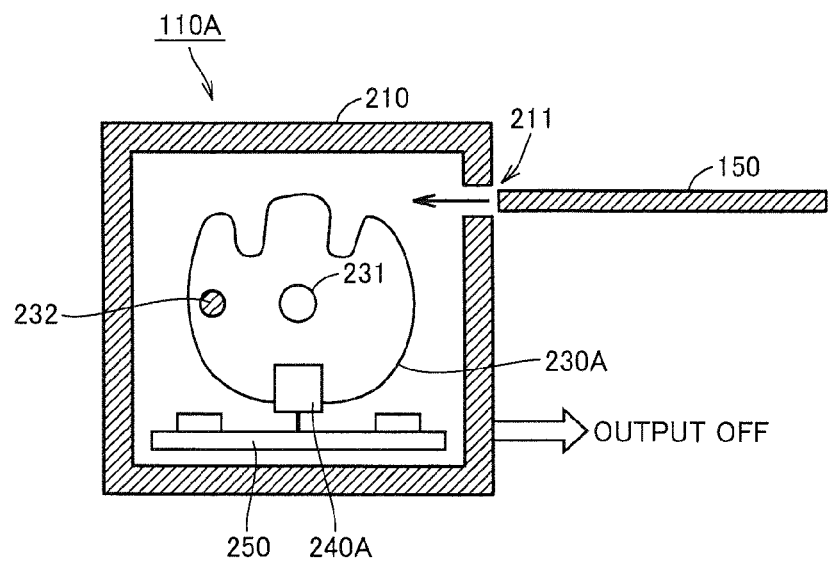
FIG. 11 is a first diagram for illustrating the structure of another example of the interlock switch according to the embodiment.
Figure 12:
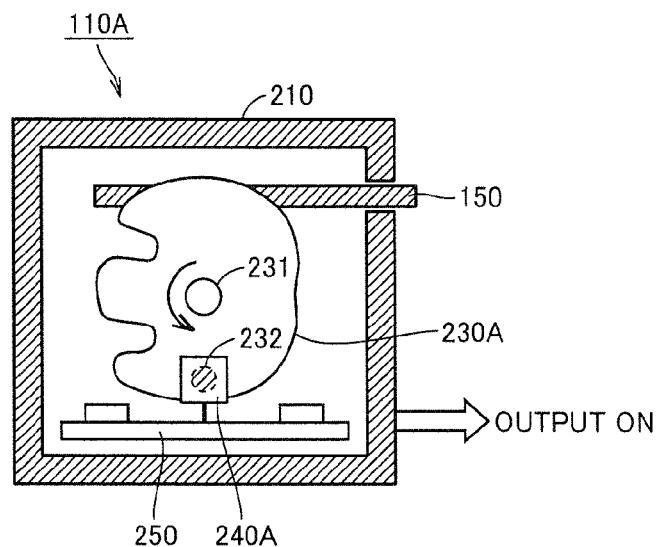
FIG. 12 is a second diagram for illustrating the structure of the other example of the interlock switch according to the embodiment.
Figure 13:
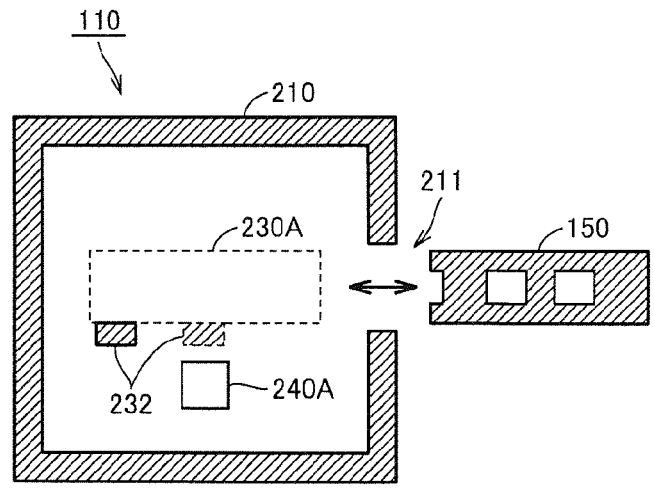
FIG. 13 is a third diagram for illustrating the structure of the other example of the interlock switch according to the embodiment.

Further, other than an optical detection element, a magnetic detection element can also be used as a detection unit. FIGS. 11 to 13 are diagrams for illustrating an internal structure of a door switch 110A according to the present embodiment when a magnetic detection element is used. FIG. 11 shows a state in which manipulation key 150 is removed, while FIG. 12 shows a state in which manipulation key 150 is inserted. FIG. 13 shows a state when viewed from the top of FIG. 11 or 12. It is noted that in door switch 110A, a cam 230A and a detection unit 240A substitute for cam 230 and detection unit 240 in door switch 110 described in FIGS. 8 to 10. A description of elements common between FIGS. 11 to 13 and FIGS. 8 to 10 will not be repeated.

Referring to FIGS. 11 to 13, cam 230A has a magnetic element 232 mounted on a portion corresponding to notch 235 formed in cam 230 in FIG. 8. For magnetic element 232, for example, a permanent magnet and a metal plate are used depending on the type of detection unit 240A.

Detection unit 240A is a magnetic detection element and caused to output a detection signal of ON by the approach of magnetic element 232 within a predetermined distance relative to detection unit 240A. Examples of a magnetic detection element include a proximity sensor, a Hall element, a reed switch, and the like.

In such a configuration, when manipulation key 150 is removed, magnetic element 232 and detection unit 240A are separated from each other; therefore, detection unit 240A outputs a detection signal of OFF. On the other hand, when manipulation key 150 is inserted, with this insertion, cam 230A rotates and magnetic element 232 moves to a position opposite detection unit 240A. This causes detection unit 240A to output a detection signal of ON.

It is noted that other examples of the detection unit include, aside from those mentioned above, the use of a capacitance proximity sensor and a small, contact microswitch.

Variation of Door Switch

Although the aforementioned examples illustrate examples where an operation unit, a detection unit, and a circuit board are housed together in a single housing, the use of a single casing is not essential in the present embodiment.

Figure 14:
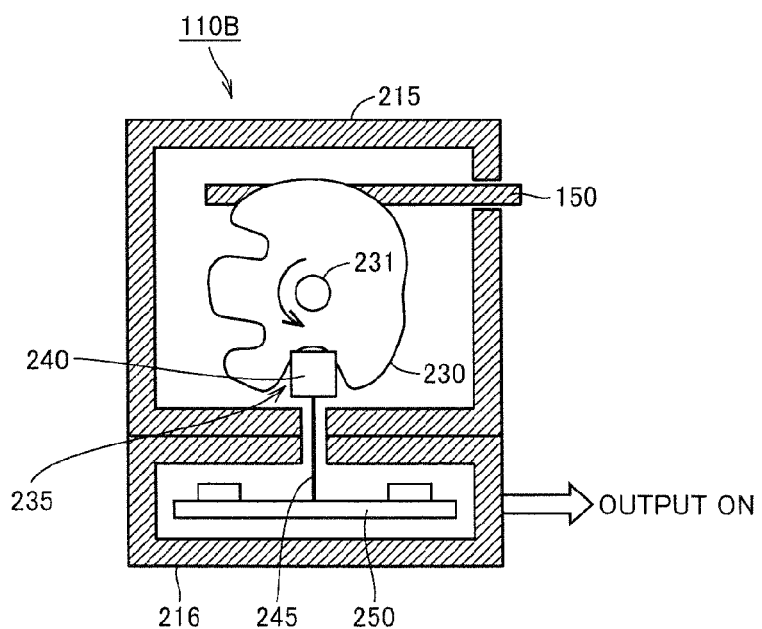
FIG. 14 is a first diagram for illustrating the structure of a further example of the interlock switch according to the embodiment.
Figure 15:
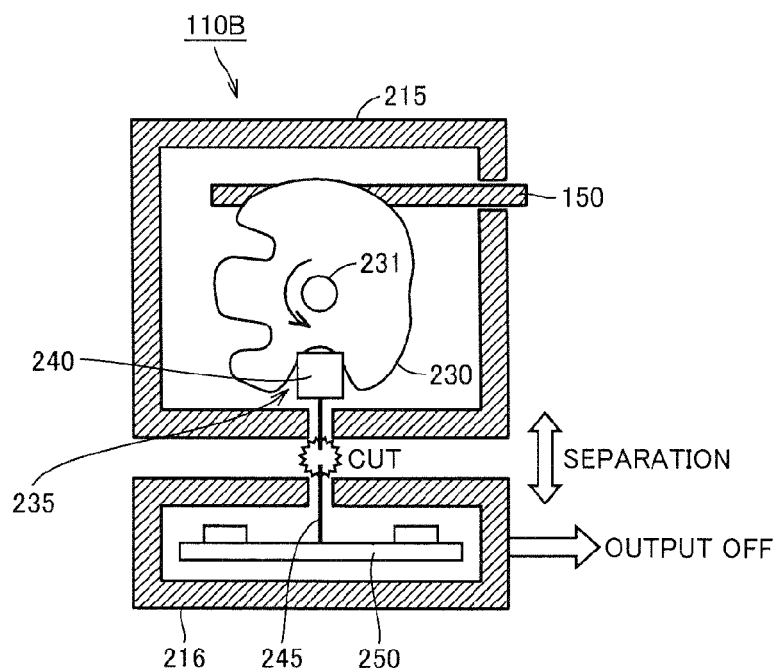
FIG. 15 is a second diagram for illustrating the structure of the further example of the interlock switch according to the embodiment.

FIGS. 14 and 15 are diagrams for illustrating an example of a door switch 110B when internal components are separately housed in two housing. It is noted that as to internal components, components having the same functions as in FIG. 8 are denoted by the same reference signs, and a description thereof will not be repeated.

Referring to FIGS. 14 and 15, door switch 110B has a structure in which an upper casing 215 and a lower casing 216 are coupled together.

In upper casing 215, cam 230 as an operation unit, and detection unit 240 are housed. On the other hand, in lower casing 216, circuit board 250 for driving detection unit 240 is housed. Detection unit 240 is connected to circuit board 250 via wiring 245.

In such a configuration, in a state in which manipulation key 150 is inserted as in FIG. 14, the rotation of cam 230 causes notch 235 formed in cam 230 to move the position of detection unit 240. This causes, as with the description in FIG. 8, a light receiving unit of detection unit 240 to detect light, and a detection signal of ON is output.

Here, when a strong impact is applied to door switch 110B and upper casing 215 and lower casing 216 are separated from each other, wiring 245 connecting detection unit 240 and circuit board 250 is cut as shown in FIG. 15. Hence, a detection signal from detection unit 240 is no longer transmitted to circuit board 250; therefore, circuit board 250 outputs a detection signal of OFF. As a result, even if the casings of door switch 110B are separated from each other with manipulation key 150 remaining in an inserted state, a detection signal to safety controller 120 in FIG. 4 is OFF; therefore, power from power supply unit 130 to motor 170 is interrupted so that the machine halts and safety is ensured.

It is noted that although the description above has illustrated a case where the entire detection unit 240 is housed in upper casing 215, for example, a configuration in which the light emitting unit of detection unit 240 is housed in upper casing 215 and the light receiving unit is housed in lower casing 216 may be employed. Again, when upper casing 215 and lower casing 216 are separated from each other, light from the light emitting unit can no longer be detected at the light receiving unit; therefore, a detection signal of OFF is output as with the above.

In this way, with a configuration in which components of the door switch are separately housed in a plurality of separable housings, it is also possible to downsize the switch as a whole through the use of an electronic device as a detection unit, and it is possible to ensure safety even when the housings are separated from each other due to a breakage of the switch.

Technique to Diagnose Door Switch

In order for a safety system to be adapted to Category 2 of ISO 13849-1, as described above, the function of monitoring an input device, i.e., a door switch in FIG. 4, is required.

Figure 16:
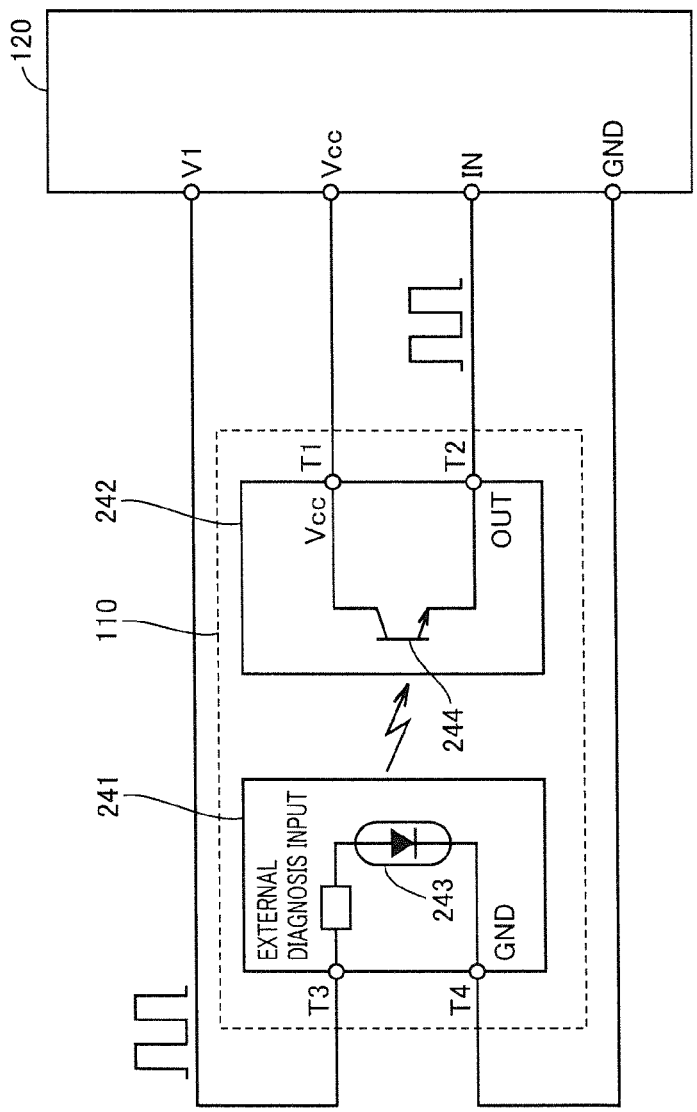
FIG. 16 is a diagram for illustration of an electrical circuit of the interlock switch according to the present embodiment.

FIG. 16 shows electrical connections between the door switch and the safety controller when the optical detection element described in FIG. 8 is used.

Referring to FIG. 16, door switch 110 includes, as described above, light emitting unit 241 and light receiving unit 242 which serve as a detection unit.

Light emitting unit 241 is provided with, for example, a light emitting diode 243 as a light receiving element. The light emitting diode has an anode connected to a terminal T3 and a cathode connected to a terminal T4.

Light receiving unit 242 is provided with, for example, a phototransistor 244 as a light receiving element. The phototransistor has a collector connected to a terminal T1 and an emitter connected to a terminal T2.

Safety controller 120 includes a power supply terminal V1 for supplying power to light emitting unit 241, a power supply terminal Vcc for supplying power to light receiving unit 242, an input terminal IN for input of a detection signal from light receiving unit 242, and a ground terminal GND.

Power supply terminal V1 and ground terminal GND are connected to terminals T3, T4 of light emitting unit 241, respectively. Power supply terminal Vcc and input terminal IN are connected to terminals T1, T2 of light receiving unit 242, respectively.

Except during a time period for monitoring door switch 110, safety controller 120 continuously applies a predetermined power supply voltage (for example, the same voltage as Vcc) to power supply terminal V1 so as to cause light emitting unit 241 to continuously radiate light. When light between light emitting unit 241 and light receiving unit 242 is in a passing state, phototransistor 244 is activated, and a detection signal of ON (i.e., logic High signal) is input to input terminal IN. On the other hand, when light between light emitting unit 241 and light receiving unit 242 is in an interrupted state, phototransistor 244 is deactivated, and a detection signal of OFF (i.e., logic Low signal) is input to input terminal IN.

In performing monitoring of door switch 110, safety controller 120 applies a voltage pulse which repeats application and halt of a power supply voltage to power supply terminal V1 in a predetermined periodic pattern. At this time, when light between light emitting unit 241 and light receiving unit 242 is in a passing state, if door switch 110 is normal, then a signal in a pattern corresponding to a voltage pulse applied to power supply terminal V1 is input to input terminal IN.

If a malfunction has occurred in any of light emitting unit 241 and light receiving unit 242, then in response to applied voltage pulses, detection signals could remain ON or OFF. In this way, by making a comparison between applied voltage pulses and input signals, the function of monitoring door switch 110 can be realized.

It is noted that when light between light emitting unit 241 and light receiving unit 242 is in an interrupted state, even if a voltage pulse is applied to light emitting unit 241, no change in light from light emitting unit 241 is detected in light receiving unit 242; therefore in this case, whether or not there is a malfunction in door switch 110 cannot be detected. However, in such an interrupted state, generally, manipulation key 150 is in a removed state, and a state in which no power is supplied to motor 170 and the safety is maintained is produced; therefore, no safety problem is caused.

Figure 17:
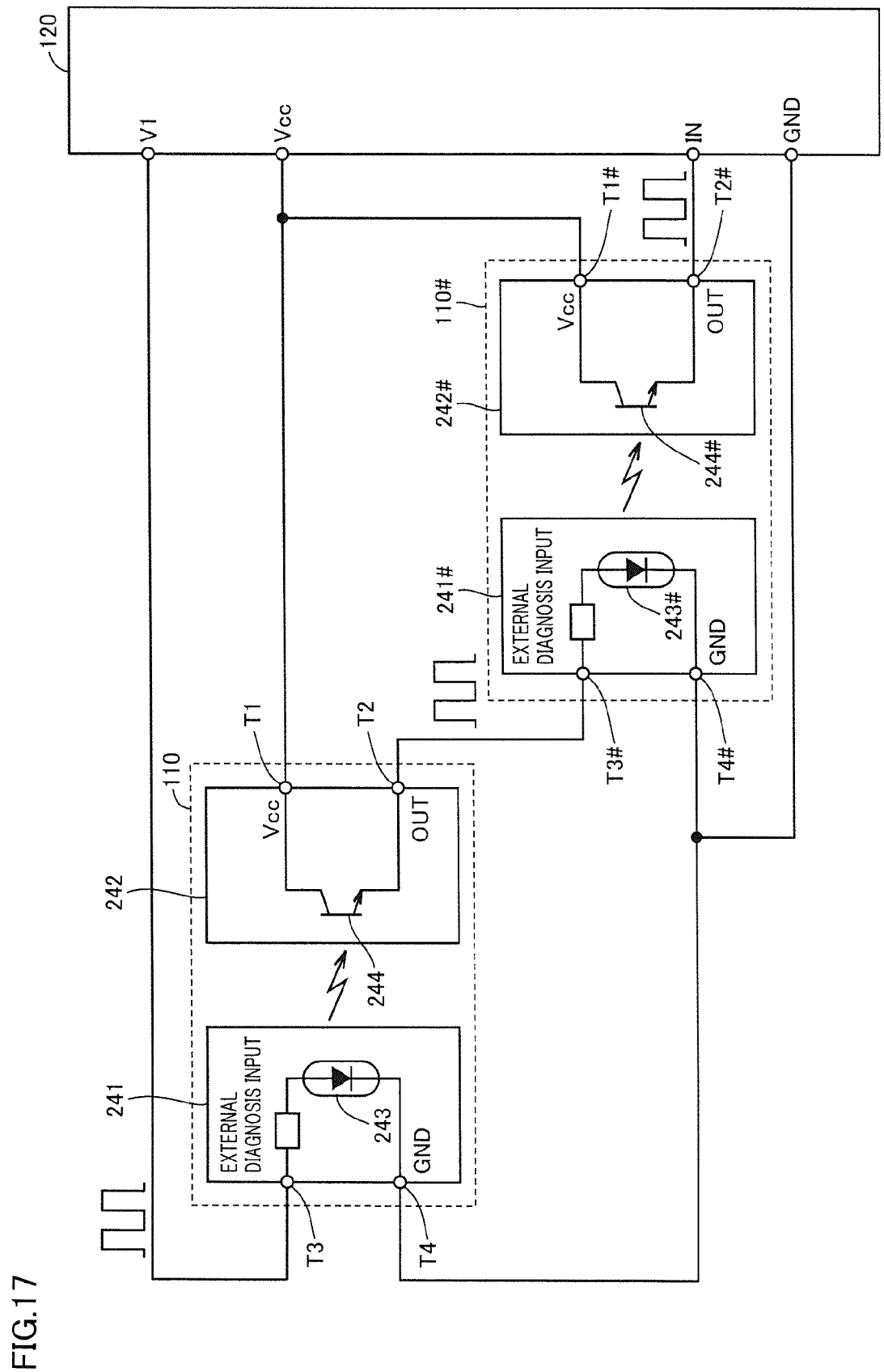
FIG. 17 is a diagram for illustration of an electrical circuit when the interlock switches according to the present embodiment are connected in series.

FIG. 17 shows electrical connections between door switches and a safety controller when a plurality of door switches are used, for example, when the protective wall has a plurality of openings. A configuration in FIG. 17 further has an additional door switch 110# compared with the configuration in FIG. 16.

Referring to FIG. 17, door switch 110# basically has the same structure as that of door switch 110. A light receiving unit 242# has a terminal T1# connected to power supply terminal Vcc of safety controller 120 and has a terminal T2# connected to input terminal IN of safety controller 120. A light emitting unit 241# has a terminal T4# connected to ground terminal GND of safety controller 120. Light emitting unit 241# has a terminal T3# connected to terminal T2 of door switch 110.

In this way, a plurality of door switches connected in cascade make it possible to detect a malfunction by means of safety controller 120 when a malfunction occurs in at least one of the door switches.

It is noted that a connection of door switches is not limited to the connection system as shown in FIG. 17, and may be, for example, in a system connecting the light emitting units in parallel with power supply terminal V1 and ground terminal GND of safety controller 120 and connecting the light receiving units in series between power supply terminal Vcc and input terminal IN of safety controller 120.

Example adapted Category 3 or 4 of ISO 13849-1

The description above has illustrated door switches which can be adapted to Category 2 of ISO 13849-1.

Next, a description will be given on a door switch which exerts the same effects as those of the above-described door switches and can be adapted to Category 3 or 4 of ISO 13849-1.

As described in FIG. 2, the safety control system adapted to Category 3 or 4 of ISO 13849-1 is required to have a configuration in which an input device and a logical operation device are duplexed and to have a cross-monitoring function between logical operation devices.

Figure 18:
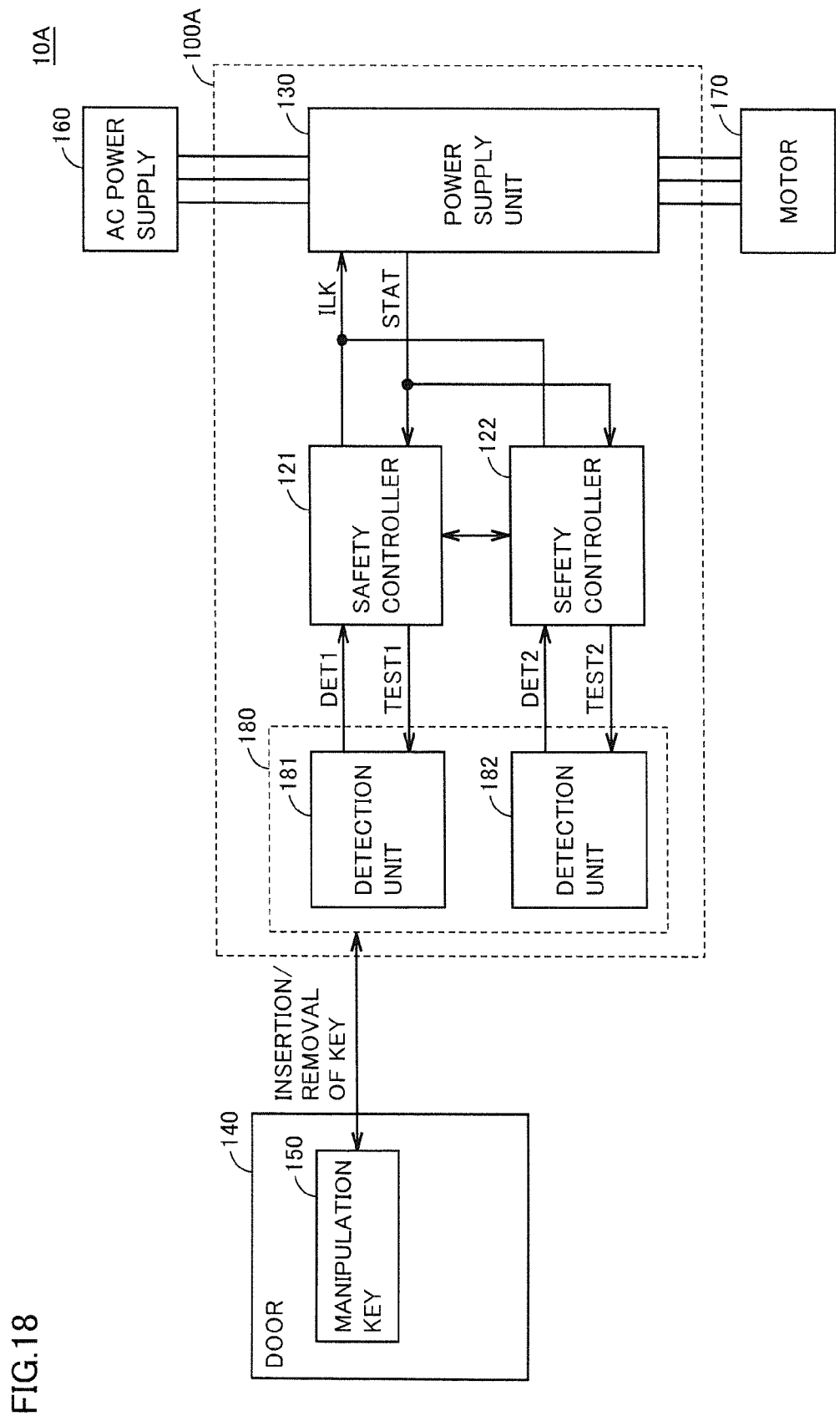
FIG. 18 shows one example of a safety control system using an interlock switch complying with Category 3 or 4 of ISO 13849-1.

FIG. 18 shows a safety control system 10A using an interlock switch adapted to Category 3 or 4 of ISO 13849-1.

Referring to FIG. 18, control system 100A includes a door switch 180 including two detection units 181, 182 instead of door switch 110 in FIG. 4 and includes safety controllers 121, 122 corresponding to two detection units 181, 182, respectively.

The functions of each safety controller and detection unit is the same as the functions of safety controller 120 and door switch 110 in FIG. 4; therefore, a description thereof will not be repeated. However, two safety controllers 121, 122 have an additional cross-monitoring function of mutually detecting whether or not there is a malfunction in the other.

In this way, a door switch configured to include a plurality of detection units can provide an interlock switch adapted to Category 3 or 4 of ISO 13849-1.

Figure 19:
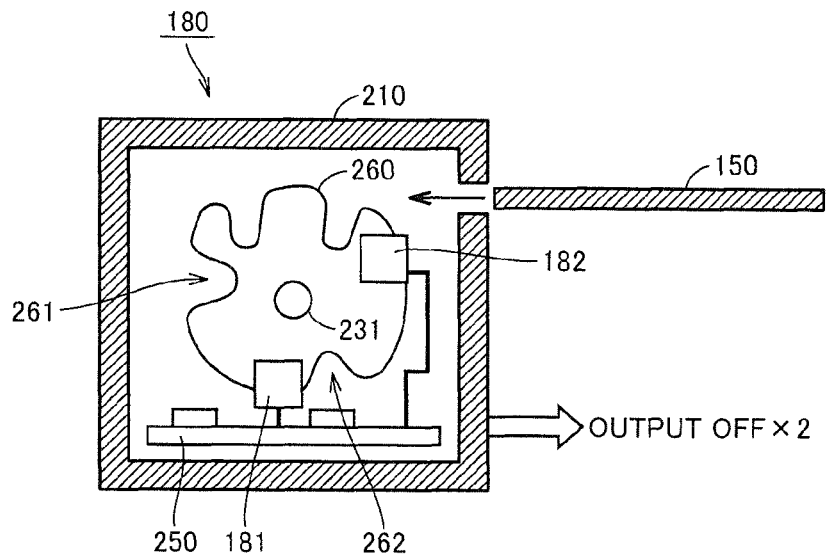
FIG. 19 is a first diagram for illustrating the structure of an interlock switch which is according to the present invention and can be used for the system in FIG. 18.
Figure 20:
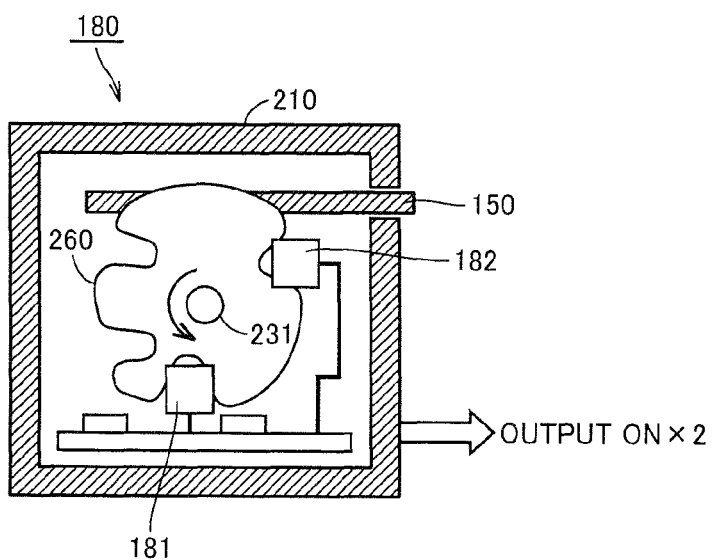
FIG. 20 is a second diagram for illustrating the structure of the interlock switch which is according to the present invention and can be used for the system in FIG. 18.

FIGS. 19 and 20 are diagrams for illustrating an example of an internal configuration of such door switch 180 including a plurality of detection units. FIG. 19 shows a state in which manipulation key 150 is removed, while FIG. 20 shows a state in which manipulation key 150 is inserted.

Referring to FIGS. 19 and 20, door switch 180 includes a cam 260 substituting for cam 230 of door switch 110 in FIG. 8 and includes two detection units 181, 182 instead of detection unit 240.

Cam 260 has two notches 261, 262 formed therein. Detection units 181, 182 are arranged at positions corresponding to where notches 261, 262 are located when cam 260 is caused to rotate by insertion of manipulation key 150. With such a configuration, it is possible to detect an operating state of cam 260 as the operation unit by means of two detection units 181, 182.

It is noted that although FIGS. 19 and 20 illustrate a configuration in which individual notches 261, 262 corresponding to two detection unit 181, 182 are formed in cam 260, two detection units may be arranged adjacent to each other when, for example, detection units are small in size, so that an operating state of the same notch may be detected by the two detection units.

Even without the use of such a door switch having two detection units, it is also possible to provide a safety control system adapted to Category 3 or 4 of ISO 13849-1 by configuring a control system equivalent to the control system in FIG. 18 through the use of two door switches having one detection unit and shown in FIG. 8.

It should be understood that the embodiment disclosed herein is illustrative and non-restrictive in every respect. The scope of the present invention is defined by the terms of the claims rather than the above description, and is intended to include any modifications within the scope and meaning equivalent to the terms of the claims.

REFERENCE SIGNS LIST 10, 10A safety control system; 100, 100A control system; 110, 110A, 110B, 180, 300 door switch; 120, 121, 122 safety controller; 130 power supply unit; 140 door; 150, 330 manipulation key; 160 AC power supply; 170 motor; 181, 182, 240, 240A, 380 detection unit; 210, 215, 216, 310, 320 casing; 211, 311 insertion opening; 230, 230A, 260, 340 cam; 231, 341 rotation shaft; 232 magnetic element; 235, 261, 262, 342 notch; 241, 241# light emitting unit; 242, 242# light receiving unit; 243, 243# light emitting diode; 244, 244# phototransistor; 245 wiring; 250 circuit board; 350 manipulation rod; 360 spring mechanism; 365 moving contact; 370 fixed contact; GND ground terminal; T1-T4, T1#-T4# terminal; V1, Vcc power supply terminal.

The invention claimed is:

1. A switch comprising:
   a first casing;
   a second casing coupled to said first casing;
   an operation unit configured to be caused to operate by manipulation of an actuator, said actuator including a key; and
   a detection unit including a photomicrosensor configured to optically detect an operating state of said operation unit and outputting a signal concerning said detected operating state, wherein
   said operation unit is configured to be caused to operate by insert manipulation of inserting said key into said first casing when said key has a shape adapted to a shape of said operation unit, and not to be caused to operate by said insert manipulation when said key does not have a shape adapted to the shape of said operation unit,
   said operation unit in the operating state permits light of said detection unit to pass, and said operation unit in a non-operating state blocks said light,
   said first casing houses said operation unit and at least a part of said detection unit, and
   when said first casing and said second casing are separated from each other, said detection unit outputs a signal indicating that said operation unit is in a non-operating state.

2. The switch according to claim 1, wherein said first casing has a substantially cubic shape.

3. The switch according to claim 1, further comprising a circuit board for driving said detection unit, wherein
   said operation unit and said detection unit are housed in said first casing,
   said circuit board is housed in said second casing, and
   said detection unit outputs a signal indicating that said operation unit is in a non-operating state when said first casing and said second casing are separated from each other and accordingly signal transmission between said detection unit and said circuit board is interrupted.

4. The switch according to claim 1, further comprising an input unit configured to receive an externally supplied test signal for monitoring whether or not there is a malfunction in said switch, wherein
   said detection unit outputs a signal corresponding to said test signal received at said input unit when no malfunction has occurred.

5. The switch according to claim 1, wherein said detection unit includes at least two detection elements.

* * * * *